(12) United States Patent
Varone et al.

(10) Patent No.: US 6,318,091 B1
(45) Date of Patent: Nov. 20, 2001

(54) CRYOPUMP SYSTEM WITH MODULAR ELECTRONICS

(75) Inventors: John J. Varone, Seekonk; Daniel R. Jankins, Randolph; Robert J. Lepofsky, Mansfield, all of MA (US)

(73) Assignee: Helix Technology Corporation, Mansfield, MA (US)

( * ) Notice: Subject to any disclaimer, the term of this patent is extended or adjusted under 35 U.S.C. 154(b) by 0 days.

(21) Appl. No.: 09/438,736

(22) Filed: Nov. 11, 1999

Related U.S. Application Data

(60) Provisional application No. 60/161,982, filed on Oct. 28, 1999.

(51) Int. Cl.[7] .................................................. B01D 8/00
(52) U.S. Cl. ............................................ 62/55.5; 361/729
(58) Field of Search ............................. 62/55.5; 361/729

(56) References Cited

U.S. PATENT DOCUMENTS

| | | | |
|---|---|---|---|
| 4,700,275 | 10/1987 | Wood | 361/393 |
| 4,918,930 | 4/1990 | Gaudet et al. | 62/55.5 |
| 4,938,351 | 7/1990 | Lewis | 206/328 |
| 4,958,499 | * 9/1990 | Haefner et al. | 62/55.5 |
| 5,159,534 | 10/1992 | Hudson et al. | 361/391 |
| 5,782,096 | 7/1998 | Bartlett et al. | 62/55.5 |

FOREIGN PATENT DOCUMENTS

| | | |
|---|---|---|
| 0 592 212 A2 | 4/1994 | (EP) . |
| 0 809 164 A1 | 11/1997 | (EP) . |
| 2 139 006 A | 10/1984 | (GB) . |

OTHER PUBLICATIONS 2 photographs of On–Board GLE product shown at Semicon West show, Jul. 1998.

* cited by examiner

*Primary Examiner*—Ronald Capossela
(74) *Attorney, Agent, or Firm*—Hamilton, Brook, Smith & Reynolds, PC

(57) ABSTRACT

A cryopump system includes an integral assembly having a refrigerator, cryopumping surfaces cooled by the refrigerator, a first electronic module for controlling the cryopump, and a second electronic module which is removably coupled to the first module. The second electronic module has a first surface abutting a complementary first surface of a housing of the first electronic module. Preferably, the first controller module has three orthogonal surfaces of approximately the same dimensions. Electronic modules can be removably coupled to each of the three surfaces.

The cryopump system includes a module cap which is coupled to an end of an electronic module to shield electrical connections between two coupled electronic modules. The electronic modules comprise a channel of rectangular cross section having slots for mounting printed circuit boards.

14 Claims, 19 Drawing Sheets

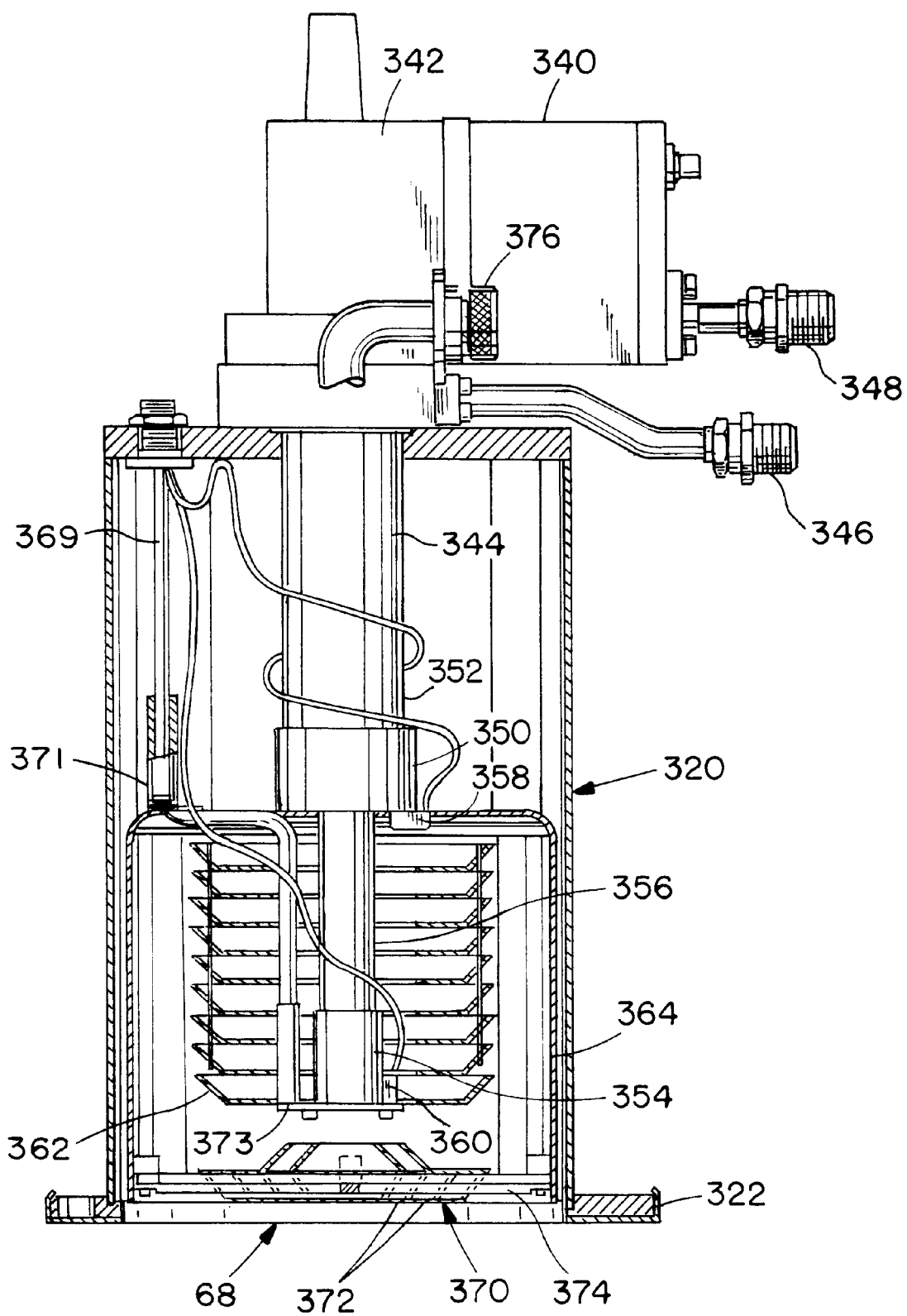
FIG. IB

CRYOPUMP SYSTEM WITH MODULAR ELECTRONICS

RELATED APPLICATIONS

This application claims priority to U.S. Provisional Application No. 60/161,982 filed Oct. 28, 1999, the entire teachings of which are incorporated herein by reference.

BACKGROUND OF THE INVENTION

Cryogenic vacuum pumps, or cryopumps, currently available generally follow a common design concept. A low temperature array, usually operating in the range of 4 to 25 K., is the primary pumping surface. This surface is surrounded by a higher temperature radiation shield, usually operated in the temperature range of 60 to 130 K., which provides radiation shielding to the lower temperature array. The radiation shield generally comprises a housing which is closed except a frontal array positioned between the primary pumping surface and a work chamber to be evacuated.

In systems cooled by closed cycle coolers, the cooler is typically a two-stage refrigerator having a cold finger which extends through the rear or side of the radiation shield. High pressure helium refrigerant is generally delivered to the cryocooler through high pressure lines from a compressor assembly. Electrical power to a displacer drive motor in the cooler is usually also delivered through the compressor.

After several days or weeks of use, the gases which have condensed onto the cryopanels, and in particular the gases which are absorbed, begin to saturate the cryopump. A regeneration procedure must then be followed to warm the cryopump and thus release the gases and remove the gases from the system. As the gases evaporate, the pressure in the cryopump increases, and the gases are exhausted through a relief valve. During regeneration, the cryopump is often purged with warm nitrogen gas. The nitrogen gas hastens warming of the cryopanels and also serves to flush water and other vapors from the cryopump.

Nitrogen is the usual purge gas because it is inert, and is available free of water vapor. It is usually delivered from a nitrogen storage bottle through a fluid line and a purge valve coupled to the cryopump.

After the cryopump is purged, it must be rough pumped to produce a vacuum about the cryopumping surfaces and cold finger to reduce heat transfer by gas conduction and thus enable the cryocooler to cool to normal operating temperatures. The rough pump is generally a mechanical pump coupled through a fluid line to a roughing valve mounted to the cryopump.

Control of the regeneration process is facilitated by temperature gauges coupled to the cold finger heat stations and by pressure gauges. The temperature and/or pressure sensors mounted to the pump are coupled through electrical leads to temperature and/or pressure indicators.

Although regeneration may be controlled by manually turning the cryocooler off and on and manually controlling the purge and roughing valves, a regeneration controller is used in more sophisticated systems. Leads from the controller are coupled to each of the sensors, the cryocooler and motor and the valves to be actuated. In U.S. Pat. No. 4,918,930 entitled "Electronically Controlled Cryopump" by Peter Gaudet, et al., the entire teachings of which are incorporated herein by reference, regeneration control electronics are integrally mounted to the cryopump.

SUMMARY OF THE INVENTION

The present invention is predicated on the recognition that there are a number of electronic functions, such as sensing elements, power conditioning modules, controller modules that can be integrated into a cryopump system.

The present invention relates to a cryopump system which includes an integral assembly having a refrigerator, cryopumping surfaces cooled by the refrigerator, a first electronic module for controlling the cryopump, and a second electronic module which is removably coupled to the first electronic module. The second electronic module is removably coupled to the first electronic module with a first surface of the second electronic module abutting a complementary first surface of a housing of the first electronic module. It should be noted that the housing could comprise a housing for the printed circuit boards or in the alternative, a housing into which the electronic controller module can slide into. Preferably, the first controller module housing has three orthogonal surfaces of approximately the same dimensions. Electronic modules can be removably coupled to each of the three surfaces.

Additional electronics can be included in a cryopump system beyond the basic controller module. The additional electronic modules may functionally include, but are not limited to control, monitoring, fault diagnostics, fault detection and fault isolation modules. For example, the modules may comprise sensor modules, power conditioning modules, and network controller modules. Each electronic module can be electrically and mechanically independent or in the alternative, can be electrically dependent on the controller module. It is not sufficient to install the additional electronic modules in one particular location. Different cryopump systems have different functional, packaging and space requirements which dictate different installation configurations. A cryopump system can include one of many electronic additions. The electronic modules of the present invention provide a level of flexibility and selectiveness to tailor the number of components and mounting locations of the components. Thus, the electronic modules facilitate the accommodation of any number and locations of modules into a cryopump system.

In a preferred embodiment, the electronic modules can be removably coupled to each other in a stack configuration. In another preferred embodiment, the electronic modules can be removably coupled to any available surface of the first electronic controller module housing. In another preferred embodiment, the electronic modules are adapted to be mounted on a bracket which can be removably coupled to any available surface in the cryopump system.

One embodiment of the cryopump system further includes a module cap which is coupled to an end of an electronic module to shield electrical connections between two coupled electronic modules. The cryopump system further includes a base cover covering a base portion of the cryopump. A module cap can be coupled to the base cover and connections between two electronic modules extend through the module cap and the base cover.

In a preferred embodiment, the cryopump system includes mechanical connector elements at each end of a surface of an electronic module to connect or couple additional modules to each other. The connector elements may include, but are not limited to, mounting clips and complementary slots. The mounting clips are seated in the complementary slots.

In a preferred embodiment, heat transfer ribs are provided on surfaces of an electronic module that are not used as the mounting surface to another electronic module.

The preferred electronic module comprises a channel of rectangular cross section having slots for mounting printed circuit boards. In a preferred embodiment, there is a standard printed circuit board form factor which is used to standardize the size of the printed circuit boards to be installed into the electronic modules.

The electronic modules can also be mounted remotely, for example in a rack or any available surface of the cryopump system.

The foregoing and other objects, features and advantages of the cryopump system will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

BRIEF DESCRIPTION OF THE DRAWINGS

FIG. 1B is a cross-sectional view of a cryopump with an electronic controller module and housing removed.

DETAILED DESCRIPTION OF THE INVENTION

The present invention relates to a cryopump system. An electronically controlled cryopump is described in U.S. Pat. No. 4,918,930 which is incorporated herein by reference. The cryopump system of the present invention includes electronic modules which provide a level of flexibility due to a standard electronic module configuration. The electronic modules can include, but are not limited to, sensor modules, power conditioning modules, or vacuum network controller modules. The modules may be, but are not limited to, being made from extruded aluminum that houses the electronics. The specific functions of the electronic modules reside within the printed circuit boards (PCB) installed in the electronic modules. The application of the PCB is obtained through the user interface panel that attaches to any electronic module. Thus, flexibility to mix and match standard products to specific customer applications is provided using the system in accordance with the present invention. Further, the modules can be from a common or different manufacturers. The electronic modules can provide functionality beyond the cryopump system, that is, the electronic modules can be attached to the cryopump system but may be functionally used with systems related to the cryopump.

Figure 1A:
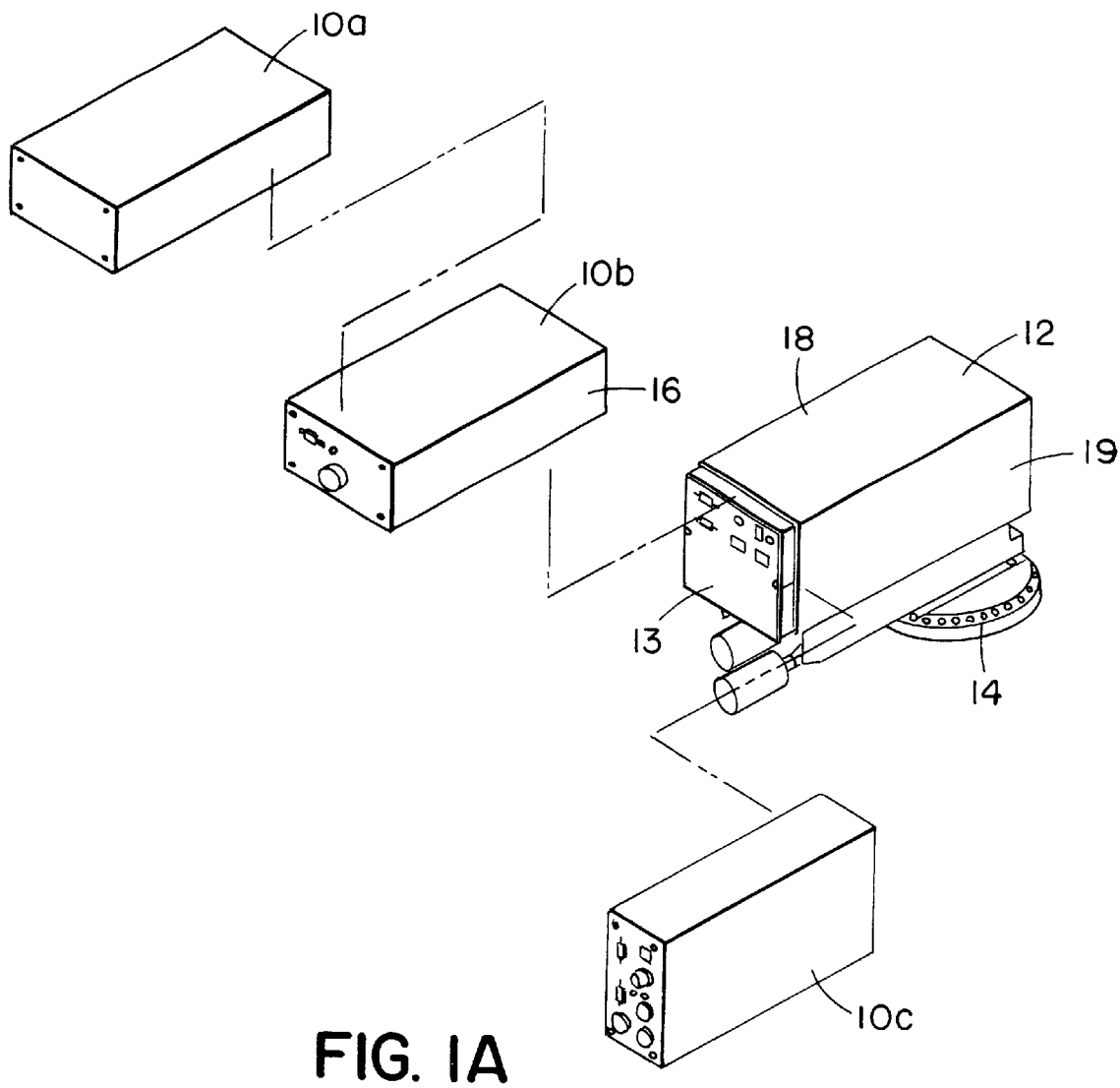
FIG. 1A is an exploded perspective view of electronic modules illustrating the versatility of electronic modules in accordance with the present invention.

Referring to FIG. 1A, the electronic modules 10a–c of the present invention can be removably coupled to or installed onto any available surface of a housing 12 of a first electronic controller module 13. The controller module 13 is coupled to the cryopump 14. The electronic modules can also be stacked for added functionality. The dimensions of the abutting surfaces of the electronic modules, for example surface 16 of the electronic module 10b and surface 18 of the controller module housing 12 are the same. The controller module housing 12 has at least three orthogonal surfaces of approximately the same dimensions. The electronic modules provide a versatility of different configurations. The electronic module 10b is removably coupled to one of the three surfaces of the controller module housing 12, in particular to the far side surface 18. The electronic module 10c is removably coupled to the other side surface 19 of the controller module housing 12. Further, the electronic module 10a is removably coupled to electronic module 10b, in a stack configuration.

As illustrated in FIG. 1B, much of the cryopump is conventional. In FIG. 1B, the housing 326 is removed to expose a drive motor 340 and a crosshead assembly 342. The crosshead converts the rotary motion of the motor 340 to reciprocating motion to drive a displacer within the two-stage cold finger 344. With each cycle, helium gas introduced into the cold finger under pressure through line 346 is expanded and thus cooled to maintain the cold finger at cryogenic temperatures. Helium then warmed by a heat exchange matrix in the displacer is exhausted through line 348.

A first-stage heat station 350 is mounted at the cold end of the first stage 352 of the refrigerator. Similarly, heat station 354 is mounted to the cold end of the second state 356. Suitable temperature sensor elements 358 and 360 are mounted to the rear of the heat stations 350 and 354.

The primary pumping surface is a cryopanel array 362 mounted to the heat sink 354. This array comprises a plurality of disks as disclosed in U.S. Pat. No. 4,555,907. Low temperature adsorbent is mounted to protected surfaces of the array 362 to adsorb noncondensible gases.

A cup-shaped radiation shield 364 is mounted to the first stage heat station 350. The second stage of the cold finger extends through an opening in that radiation shield. This radiation shield 364 surrounds the primary cryopanel array to the rear and sides to minimize heating of the primary cryopanel array by radiation. The temperature of the radiation shield may range from as low as 40 K. at the heat sink 350 to as high as 130 K. adjacent to the opening 368 to an evacuated chamber.

A frontal cryopanel array 370 serves as both a radiation shield for the primary cryopanel array and as a cryopumping surface for higher boiling temperature gases such as water vapor. This panel comprises a circular array of concentric louvers and chevrons 372 joined by a spoke-like plate 374. The configuration of this cryopanel 370 need not be confined to circular, concentric components; but it should be so arranged as to act as a radiant heat shield and a higher temperature cryopumping panel while providing a path for lower boiling temperature gases to the primary cryopanel.

Figure 2:
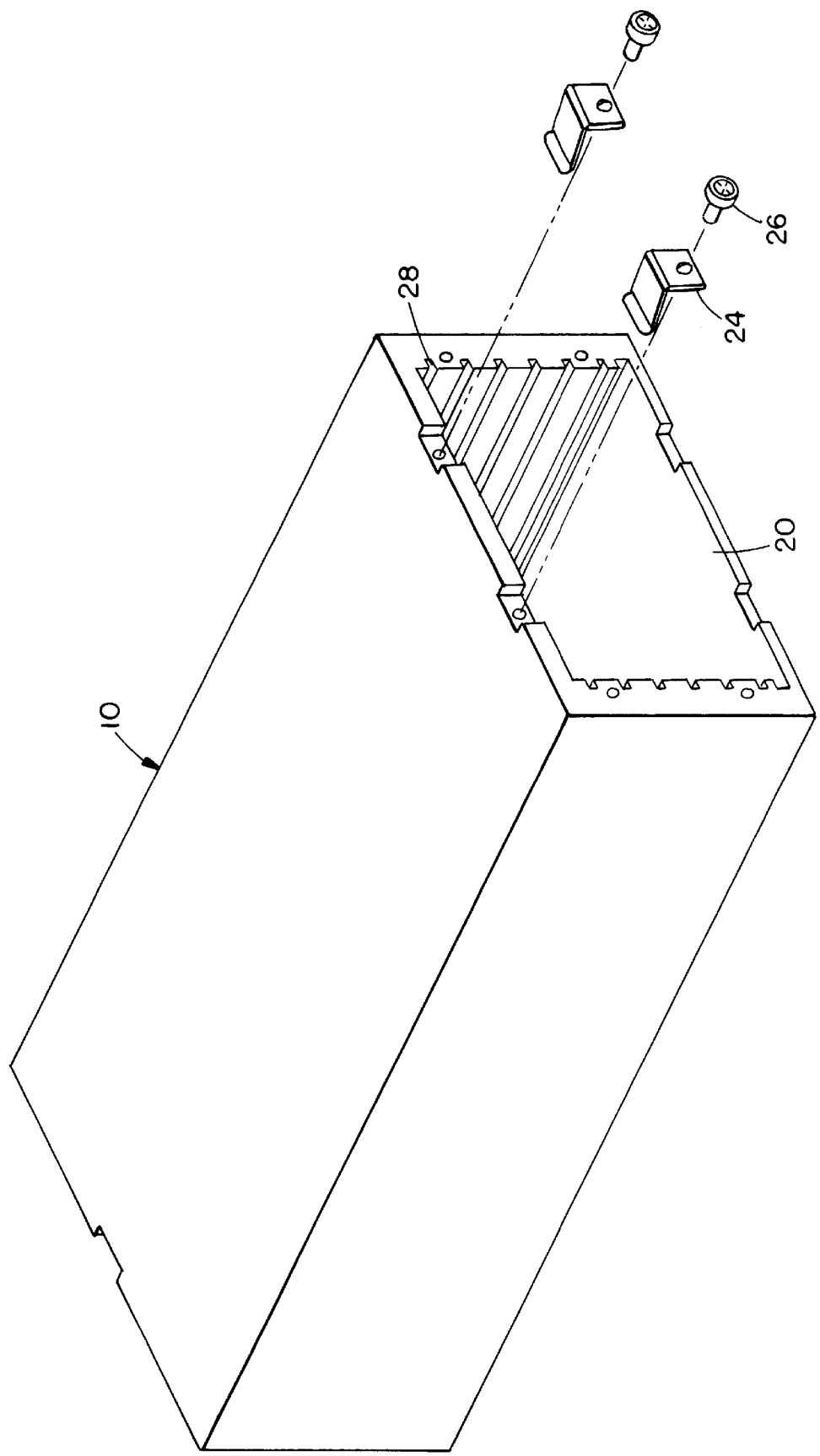
FIG. 2 is a perspective view of an electronic module in accordance with the present invention.

Referring to FIG. 2, the electronic module 10 has a channel 20 of rectangular cross section having slots 28 for mounting printed circuit boards. An electronic module 10 of 1.0× size is illustrated, however, modules can vary in size, for example, but not limited to 0.5×, 1.0×, 1.25× and 1.5× the depth of the 1.0× size, and can be used in any combination. The dimensions of the face of an electronic module are approximately the same however, the depth of the modules can be expanded to accommodate different electronics resulting in the different sizes for the modules. The electronic modules 10 are independent of the main cryopump module, thereby ensuring that functionality can be added or removed without impacting the functionality or aesthetics of the cryopump.

There are connector elements at each end of a surface of an electronic module 10 to connect or couple additional modules 10 to each other. In a preferred embodiment, the connector elements include rear mounting clips 24 with associated screws 26 for connecting electronic modules. The rear mounting clips 24 function as locators and secure the back ends of the removably coupled module to the main module or to another removably coupled electronic module.

Figure 3:
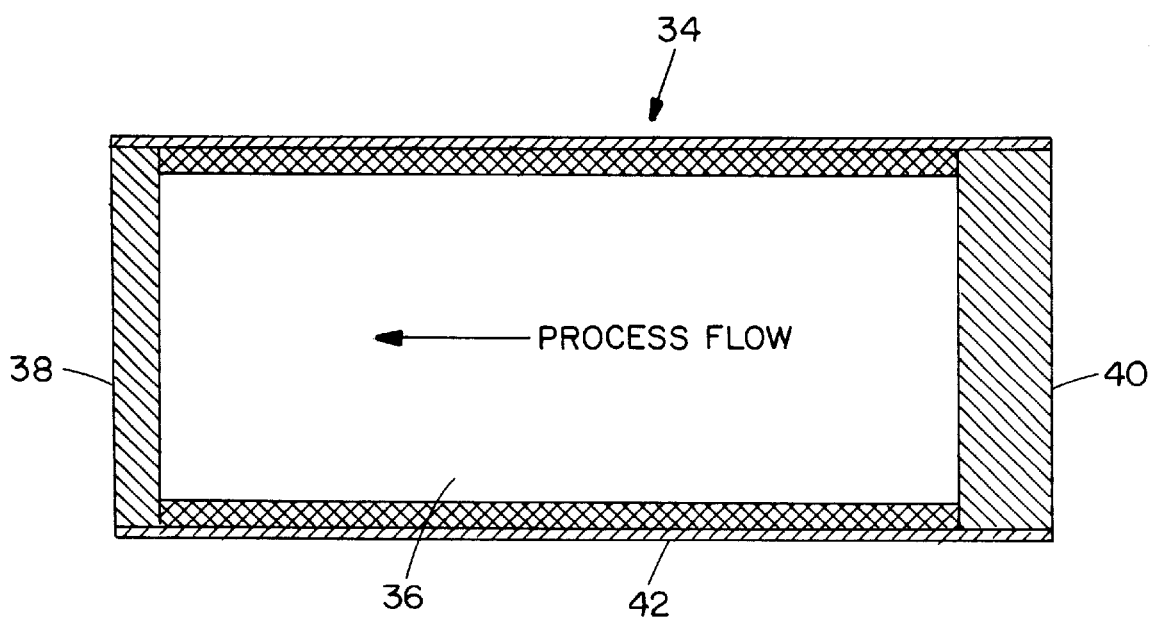
FIG. 3 is a view showing the printed circuit board form factor that is used with the electronic modules in accordance with the present invention.

Referring to FIG. 3, printed circuit boards (PCB) having the same dimensions are housed in the modules 10 thereby allowing the boards to be placed in the side slots 28 of the modules. A standard PCB form factor 34 is used for any PCB that can be installed in an electronic module 10. The usable electronics are installed in the middle region 36. The input/output connections or interfaces are provided on a first region 38 of the PCB. A second region 40 of the PCB provides for the user interfaces. The remaining edge regions 42 must be left free of electronics.

Figure 4:
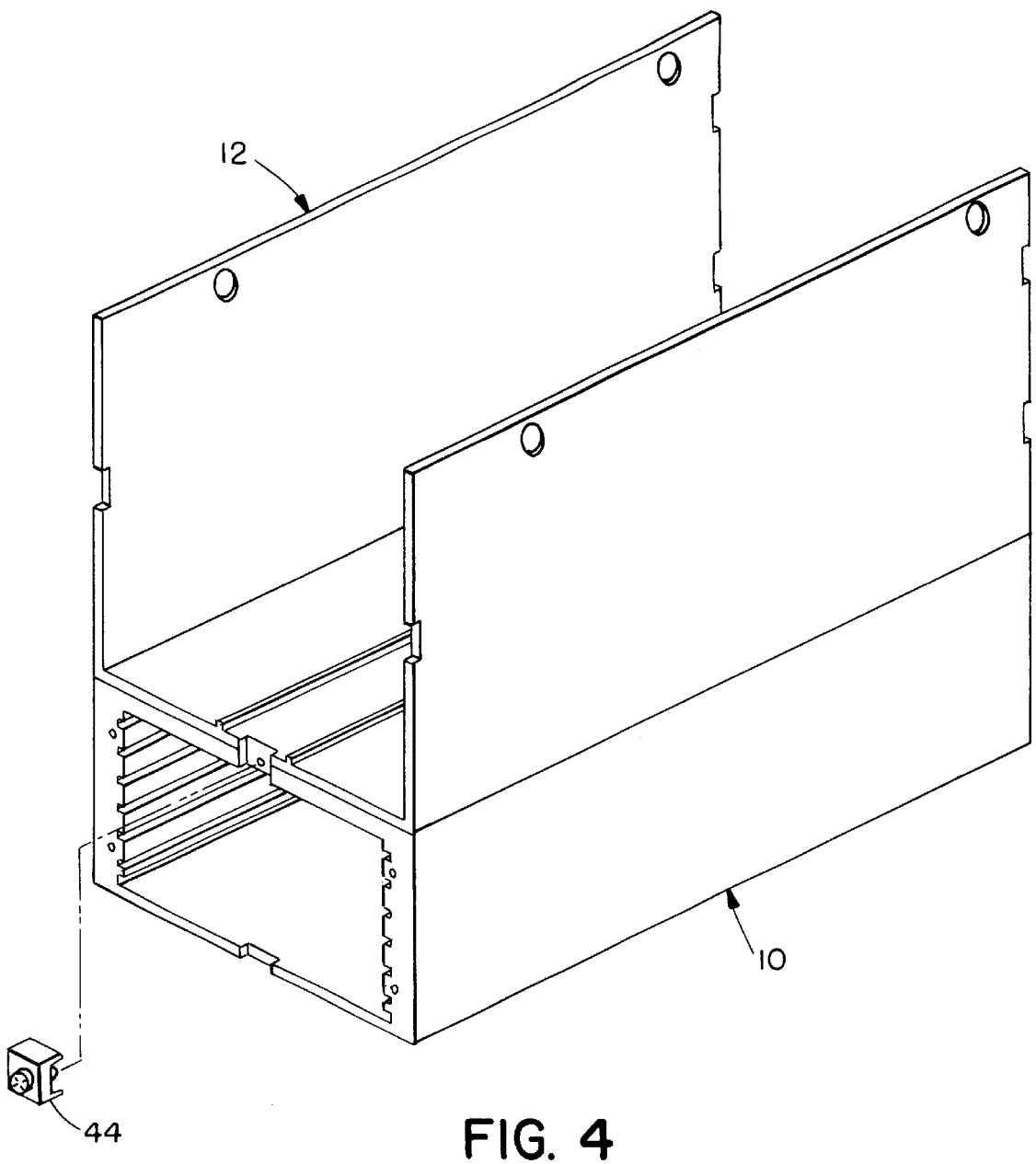
FIG. 4 is a perspective view of an electronic module showing the front mounting configuration in accordance with the present invention.
Figure 5A:
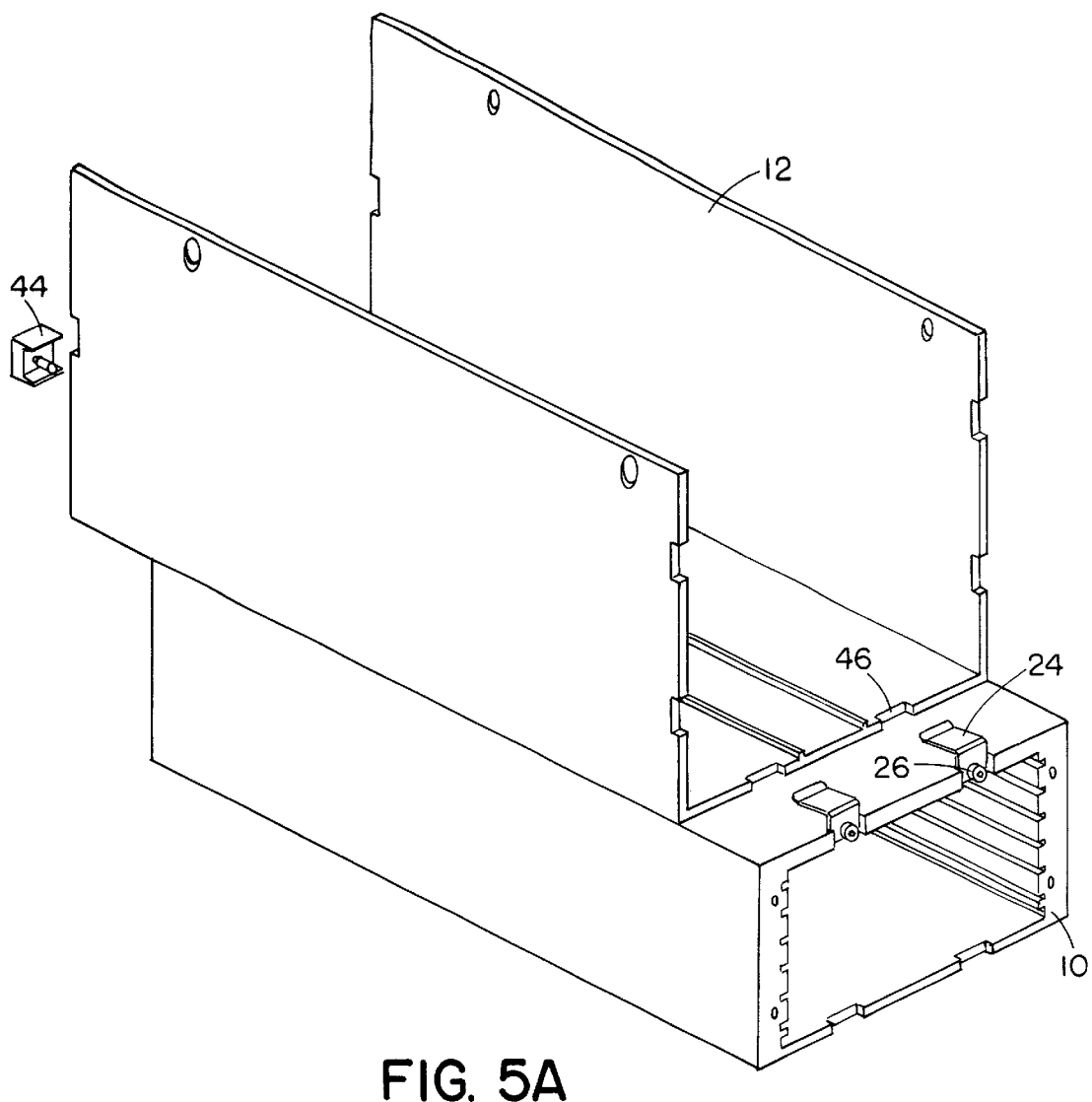
FIG. 5A is another perspective view of an electronic module from the rear as installed in accordance with the present invention.
Figure 5B:
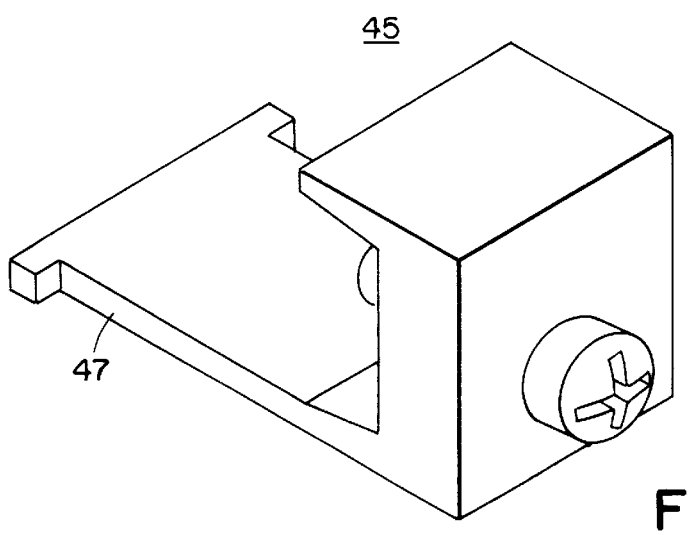
FIG. 5B is view of another preferred embodiment of a front mounting clip in accordance with the present invention.

As illustrated in FIGS. 4–8, the electronic modules 10 can be removably coupled to each other or to the first controller module housing 12 in a number of different configurations. FIG. 4 is a view of an electronic module mounted to the bottom surface of the cryopump system. Front mounting clip 44 secures the front end of an electronic module 10 to another module. FIG. 5B illustrates another preferred embodiment of the front mounting clip 45 which is used to secure the front end of the electronic module 10 to another module. The extended bottom surface 47 of the mounting clip 45 facilitates the attachment of the front end of the electronic module1 0 to another module. FIG. 5A illustrates complementary slots 46 disposed on the surfaces of an electronic module that are used to seat the rear mounting clips 24. Thus, in a preferred embodiment, a combination of the mounting clips, both front and rear, and associated complementary slots are used to removably couple the electronic modules.

Figure 6:
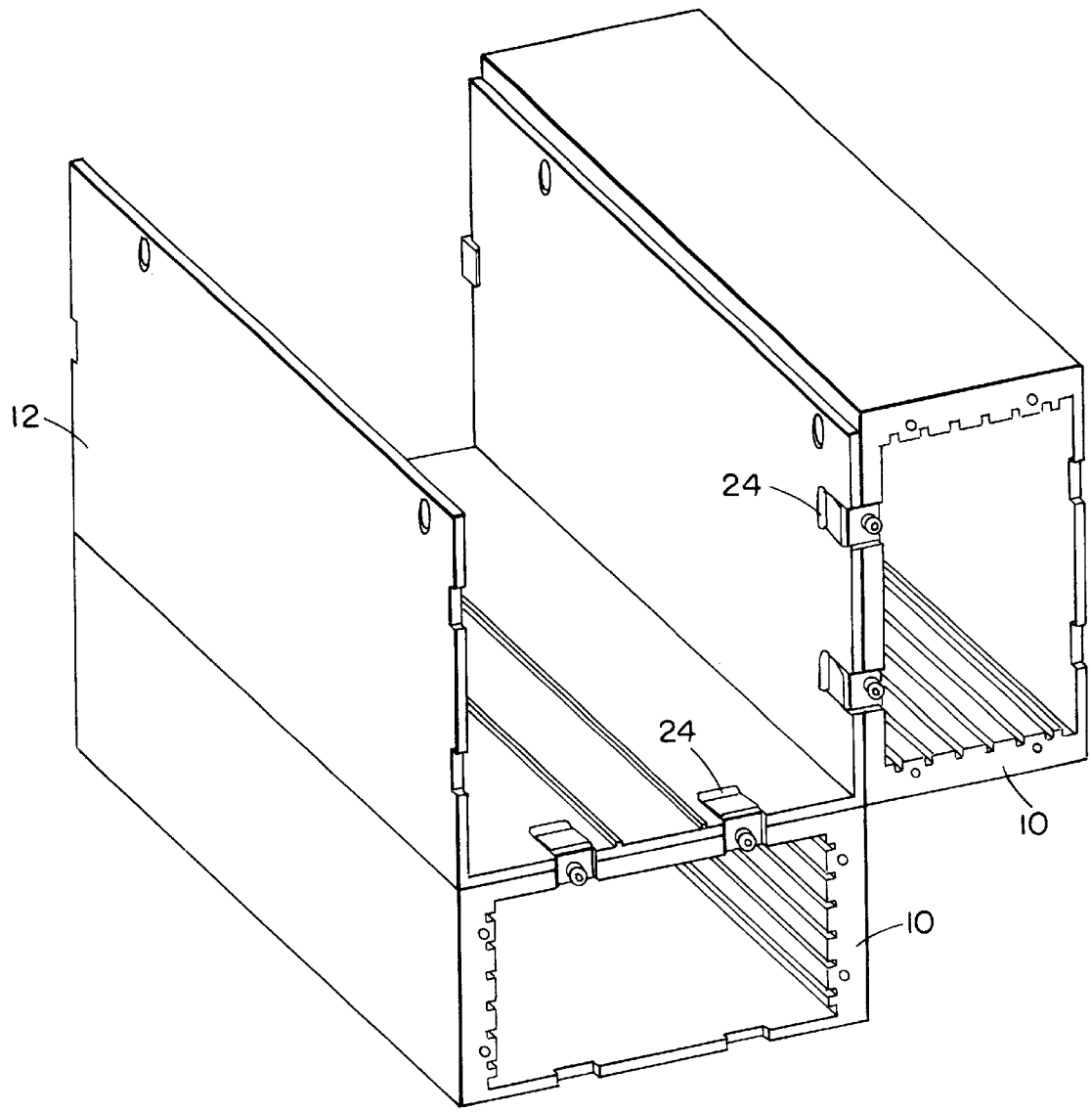
FIG. 6 illustrates a rear view of a configuration having two electronic modules installed in accordance with the present invention.
Figure 7:
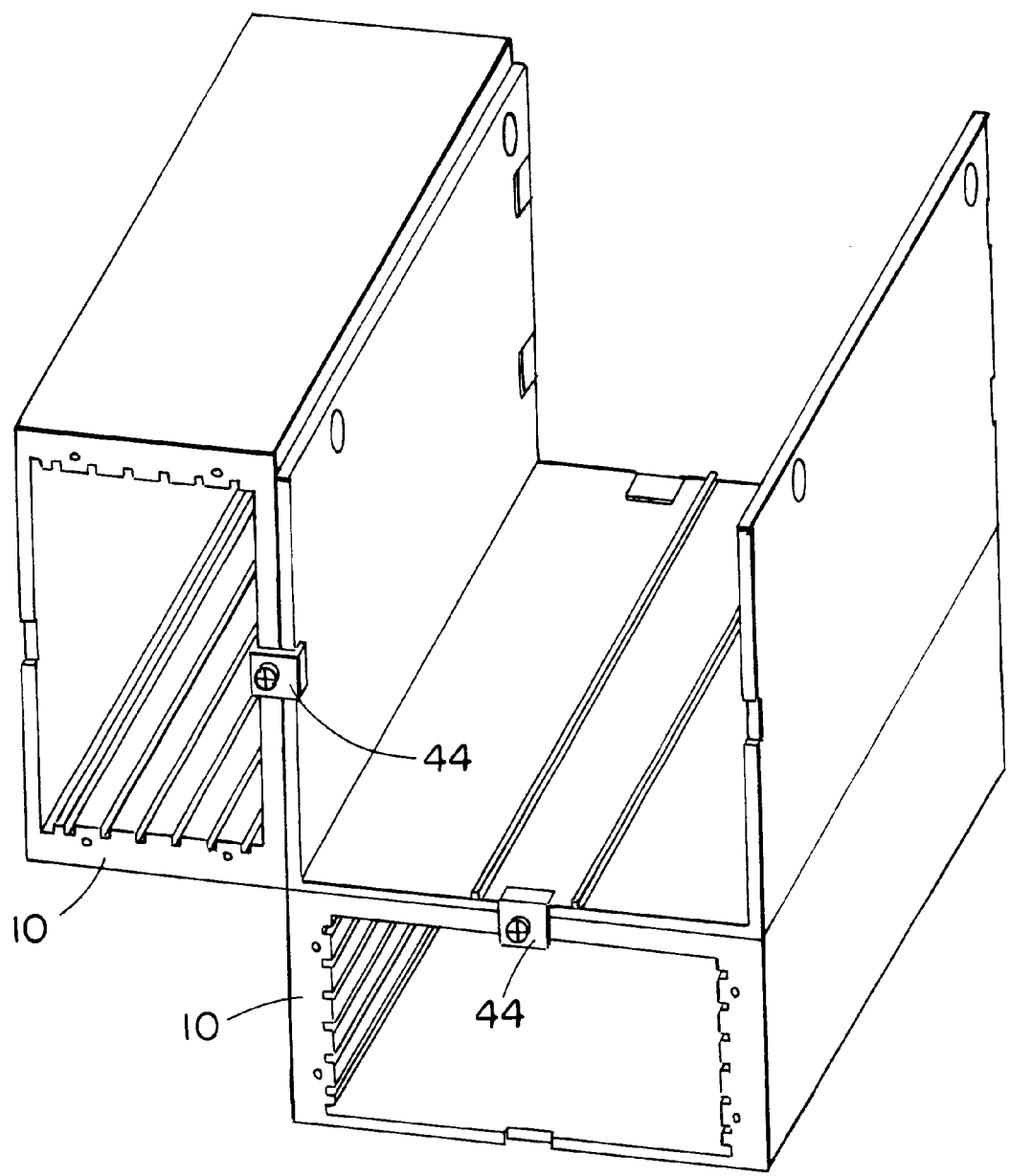
FIG. 7 is a front view of a configuration illustrating the mounting of two electronic modules in accordance with the present invention.
Figure 8:
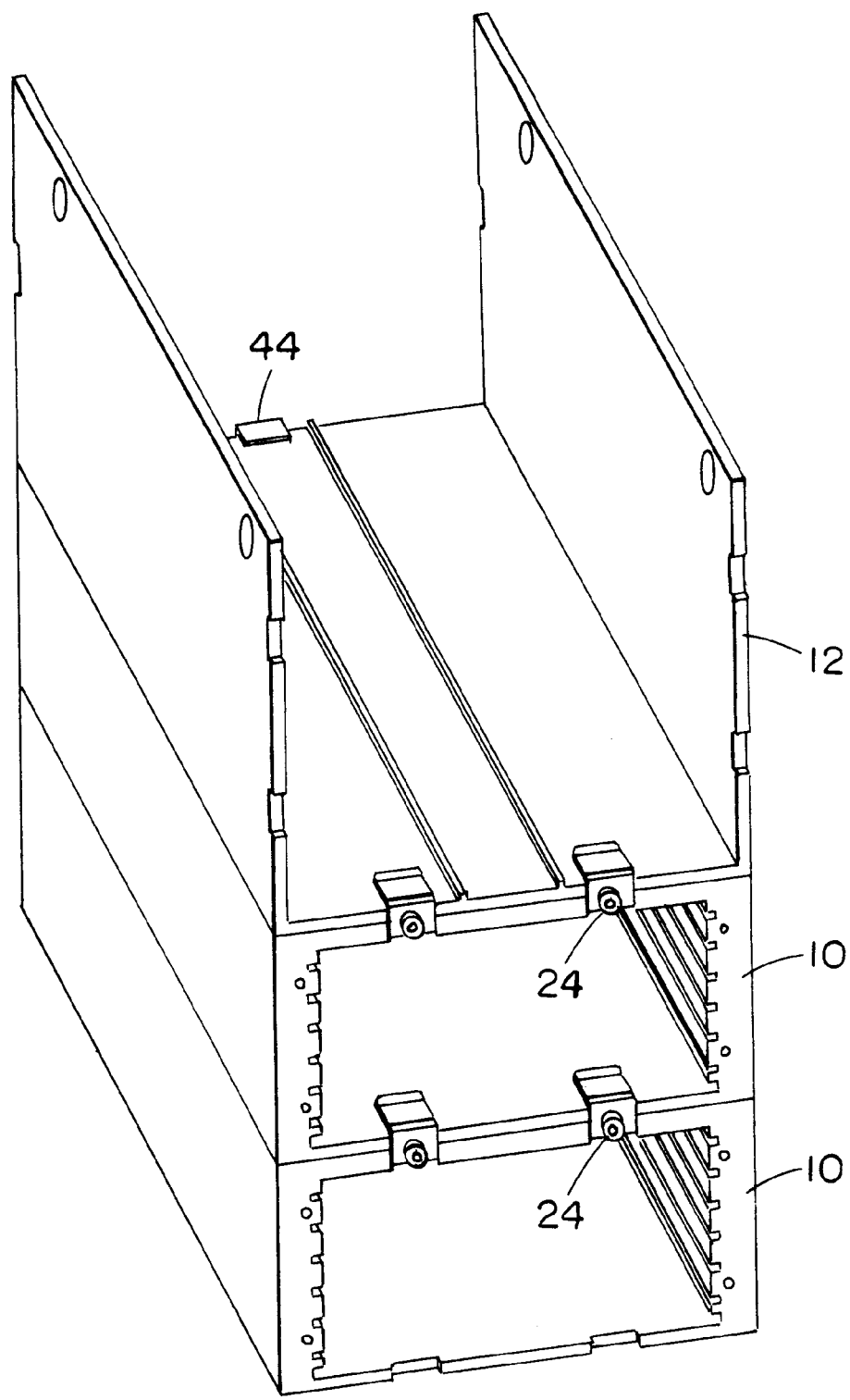
FIG. 8 is a front view of a stack configuration of two electronic modules in accordance with the present invention mounted below a controller module.

FIGS. 6 and 7 illustrate rear and front views, respectively, of electronic modules removably mounted on two surfaces of a controller module housing 12. The electronics have not been shown in the figures for clarity but the PCB's are installed in the electronic modules prior to coupling the modules together. FIG. 8 illustrates a front view of a stack configuration of two electronic modules mounted to a surface of the controller module housing 12. In use, the electronic modules are positioned using the rear mounting clips 24. The front mounting clips 44 are then installed.

Figure 9:
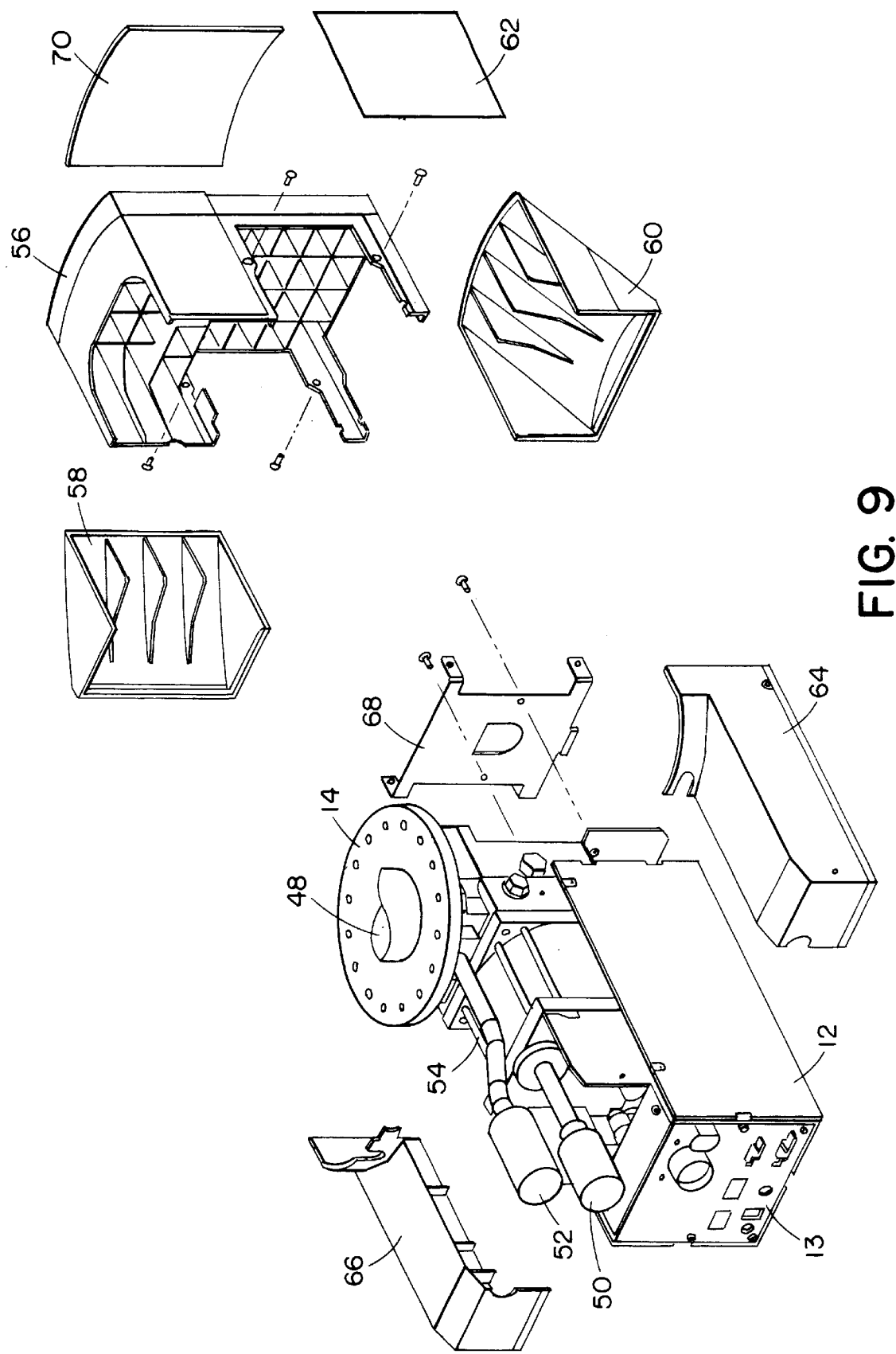
FIG. 9 is a view illustrating different configurations of module caps that are used in combination with the electronic modules in accordance with the present invention.

Referring to FIG. 9, a cryogenic vacuum pump 14 with an electronic controller module 13 adapted to be removably coupled to the cryopump is illustrated. The electronic controller module 13 has a housing 12. The electronic module 13, may store system parameters such as temperature, pressure, regeneration times and the like. Though not completely illustrated in FIG. 9, the cryopump includes a vacuum vessel 48 which has a flange to mount the pump to a system to be evacuated. Helium supply 50 and exhaust 52 lines are provided to cool the drive motor 54.

For aesthetic purposes and as electromagnetic shields, manifolds or module caps are provided for electrical connections. The manifolds include a base cover 56, a side module cap 58, a bottom module cap 60, a universal panel 62, a right half top cover 64, a left half top cover 66, a mounting bracket 68, and a logo panel 70.

For example, if an electronic module is removably coupled to the bottom surface of the housing 12 of the controller module 13, the electrical connections are covered by the base cover 56, the right half top cover 64, left half top cover 66 and the bottom module cap 60. All electrical cables are routed to and from a system patch panel which is a panel disposed on a controller module housing 12 that provides for system interconnects and an electronic module 10. The cable routing is accomplished using the manifolds or module caps of varying sizes and designs that provide an easy method to route cables while giving an aesthetic appearance to the system. The module caps shield electrical connections between two electronic modules. The inside surfaces of the module caps are conformally coated, thereby providing electromagnetic interference and electrostatic discharge (EMI/ESD) protection. The module caps are removably coupled to the electronic modules and slide on and off for routing cables between various modules.

Figure 10:
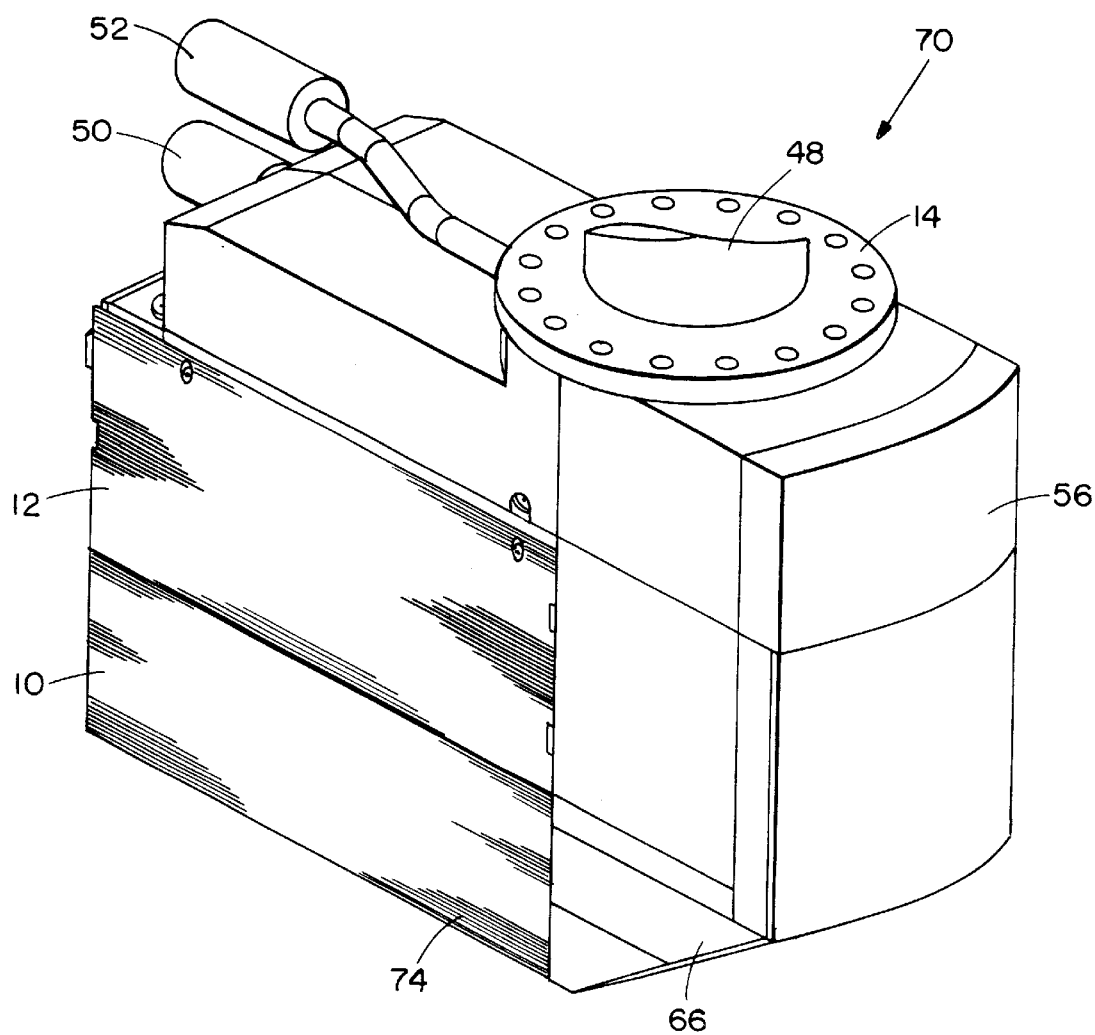
FIG. 10 is a view illustrating a cryopump system in accordance with the present invention.
Figure 11:
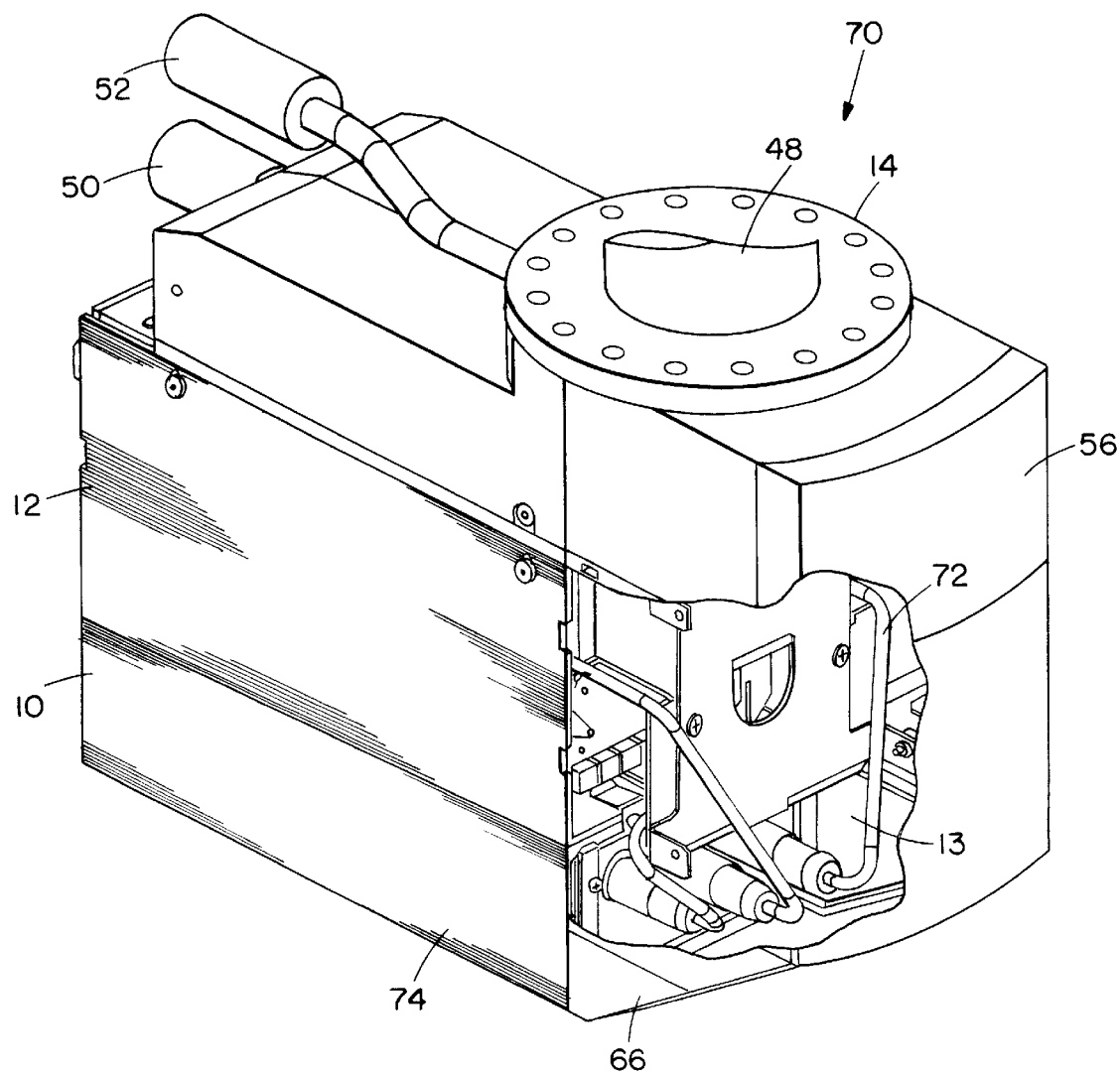
FIG. 11 is a cutaway view of the cryopump system shown in FIG. 10, further illustrating the cable routings in accordance with the present invention.

Referring to FIGS. 10 and 11, the cryopump system 70 includes a base cover 56 and a left half cover 66. Electrical connections, for example cable 72, between electronic module 10 and the controller module extend through the left half cover 66 or right half cover and up through the base cover 56 to the system patch panel in the controller module housing 12.

Further, heat transfer ribs 74 are disposed on surfaces of an electronic module 10 not used as a mounting surface. The heat transfer ribs 74 increase the surface area for heat dissipation. The heat transfer ribs are present on three surfaces of the housing 12 of the controller module which can interface and be removably coupled to an electronic module.

Figure 12:
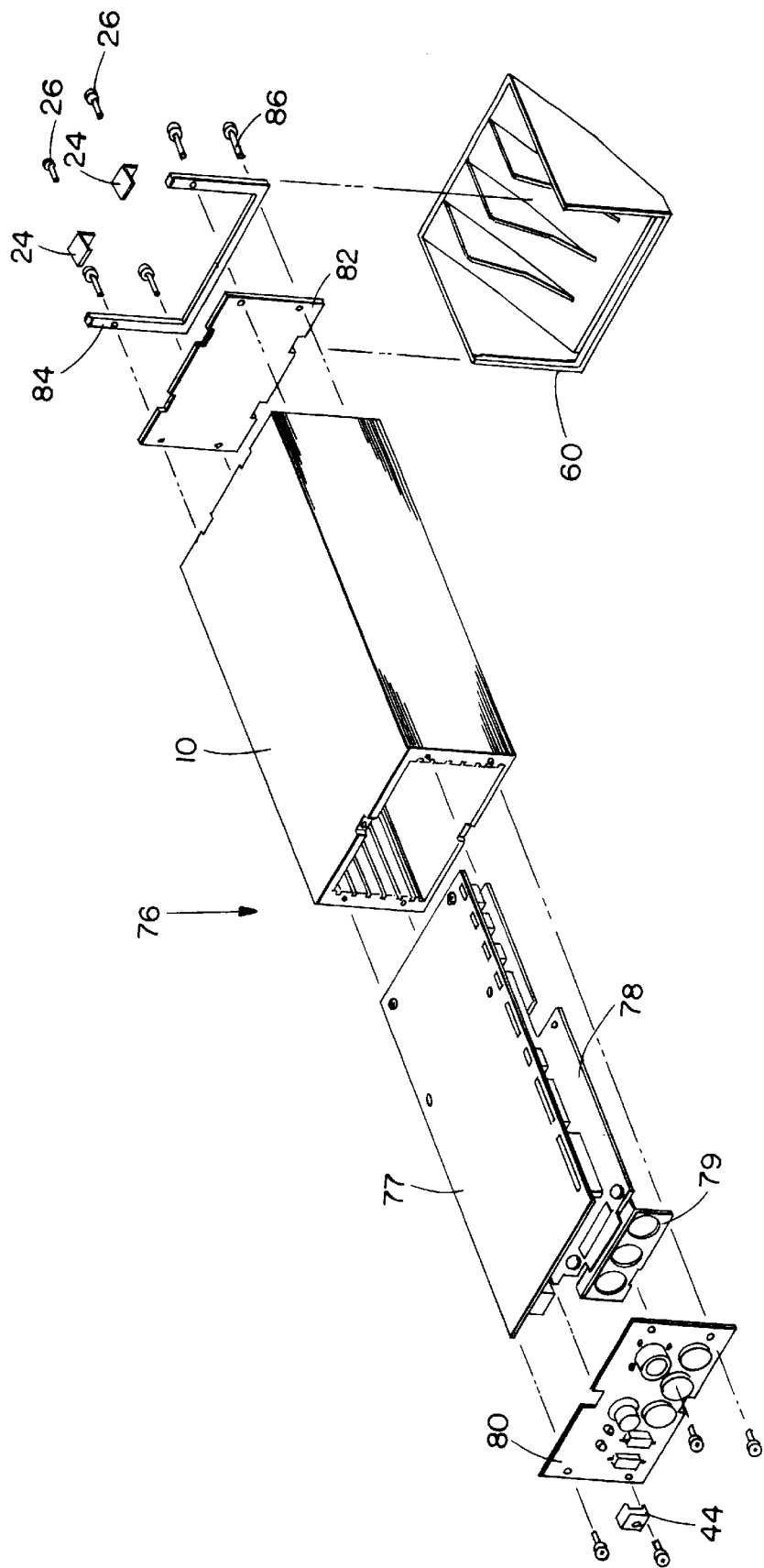
FIG. 12 is an exploded view of a vacuum network controller module in accordance with the present invention.

Referring to FIG. 12, an exploded view of a vacuum network controller (VNC) 76 includes an electronic module 10, standard printed circuit board 77, a vacuum network controller power board 78, a VNC power board mounting bracket 79, a VNC connector panel 80, a VNC rear panel 82, a module cap 60 and a module cap attachment clip 84.

Further, attachment functionality is provided by the front mounting clip 44, rear mounting clips 24 and their associated screws 26, for example a socket head cap screw, and large pan head screws 86. Thus, a VNC is formed from a standard electronic module 10 after installing the specialized VNC printed circuit boards. A VNC controller is described in a patent application filed on Jul. 13, 1998 which corresponds to U.S. Ser. No. 09/114,549, the entire contents of which are incorporated herein by reference. It should be noted that the cryopump system may include an information network which requires only one single VNC electrically connected to different cryopumps.

Figure 13:
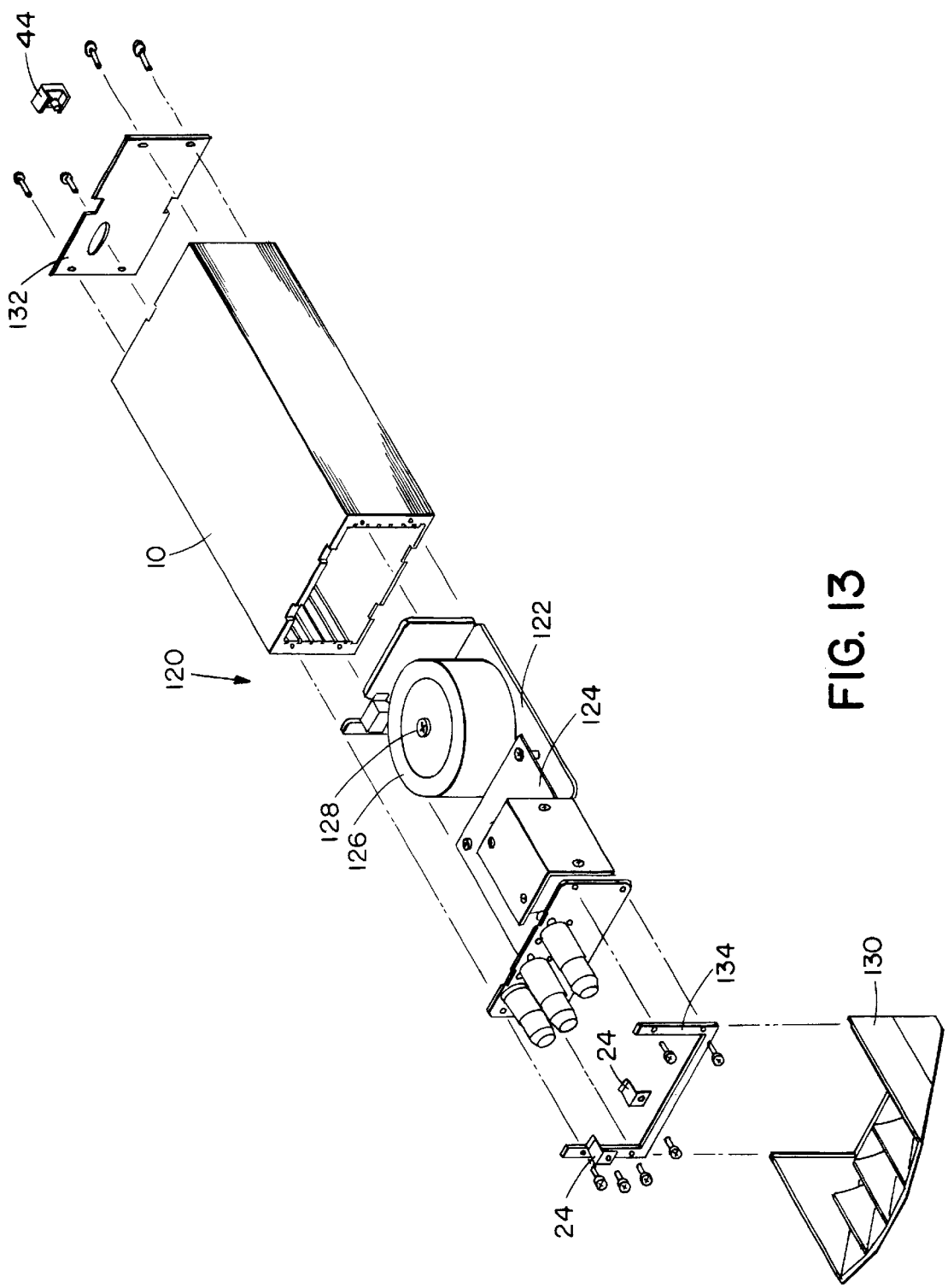
FIG. 13 is an exploded view of a power conditioning module in accordance with the present invention.

Referring to FIG. 13, a power conditioning module (PCM) 120 includes an electronic module 10, a PCM power component 122, a PCM board outline 124, a power transformer 126, a pan head screw 128, a bottom module cap 130, a PCM front panel 132, and a module cap attachment clip 134. Both rear mounting clips 24 and a front mounting clip 44 are provided to removably couple the PCM module 120 to another electronic module. The PCM 120 takes an alternating current (AC) input and conditions the input power to provide a three phase power for the cryopump motor and 24 volts AC for powering the electronic modules, valves and ancillary system components.

Figure 14:
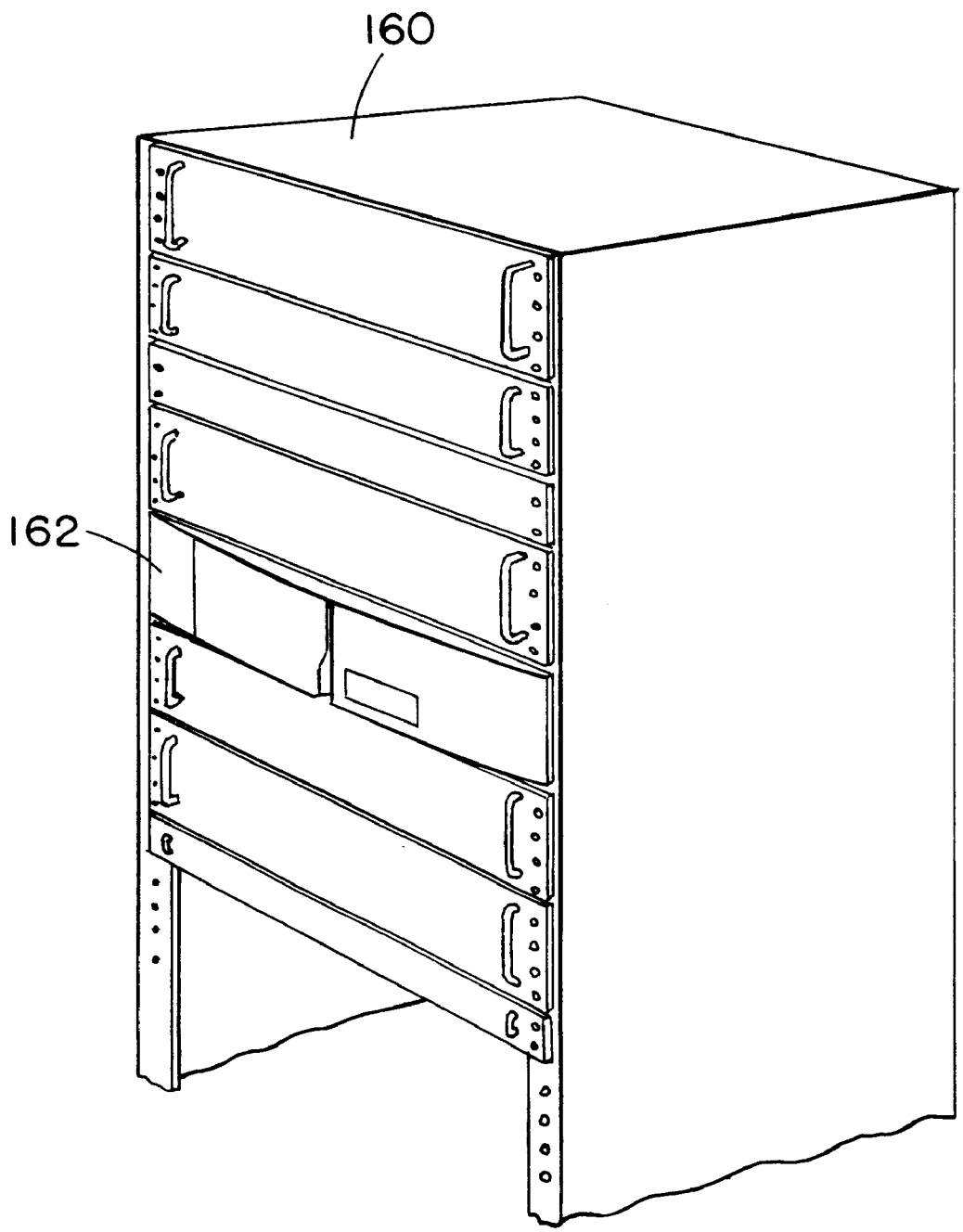
FIG. 14 is a rack configuration, housing electronic modules in accordance with the present invention.
Figure 15:
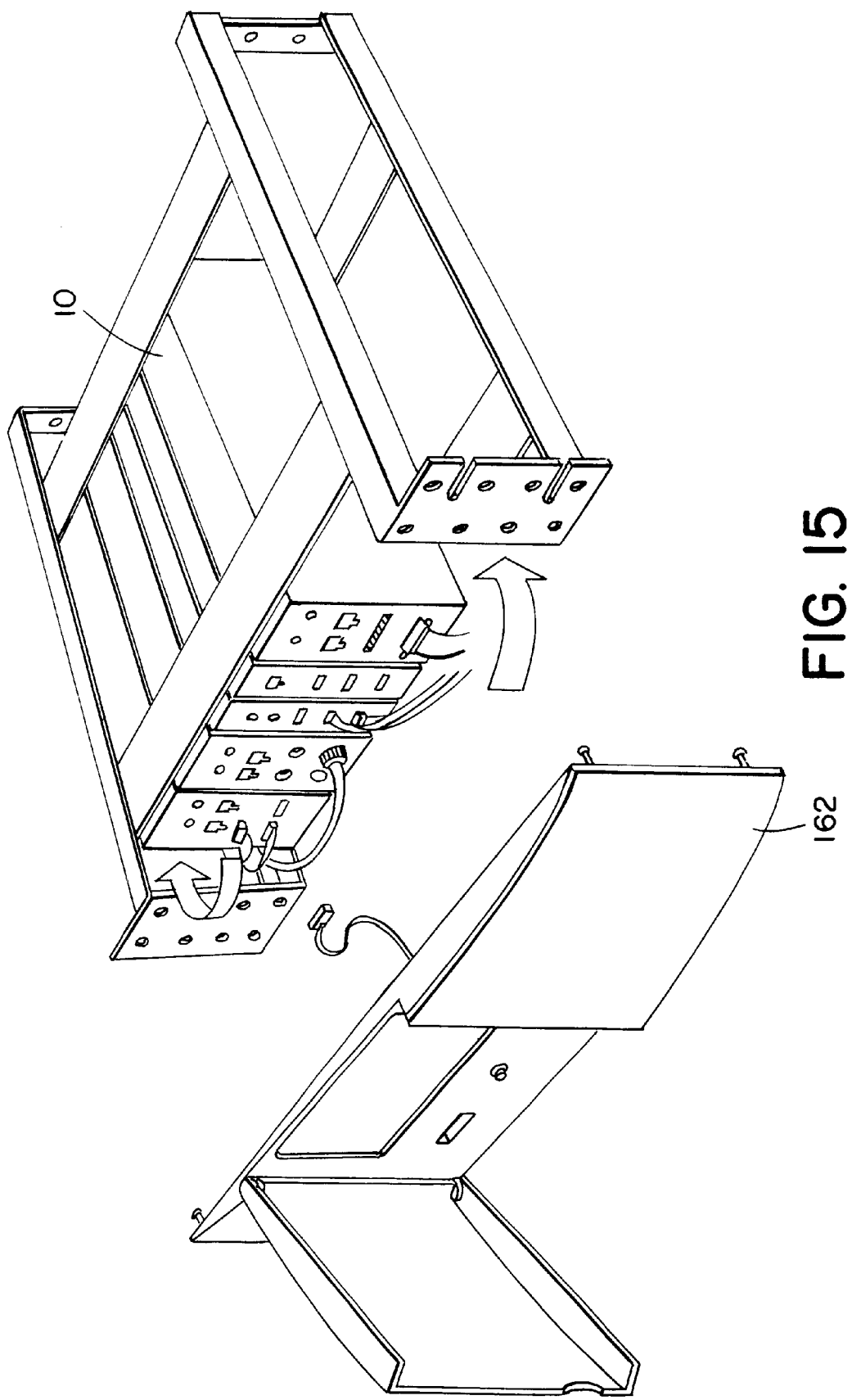
FIG. 15 is a configuration showing electronic modules as installed in a subrack configuration in accordance with the present invention.
Figure 16:
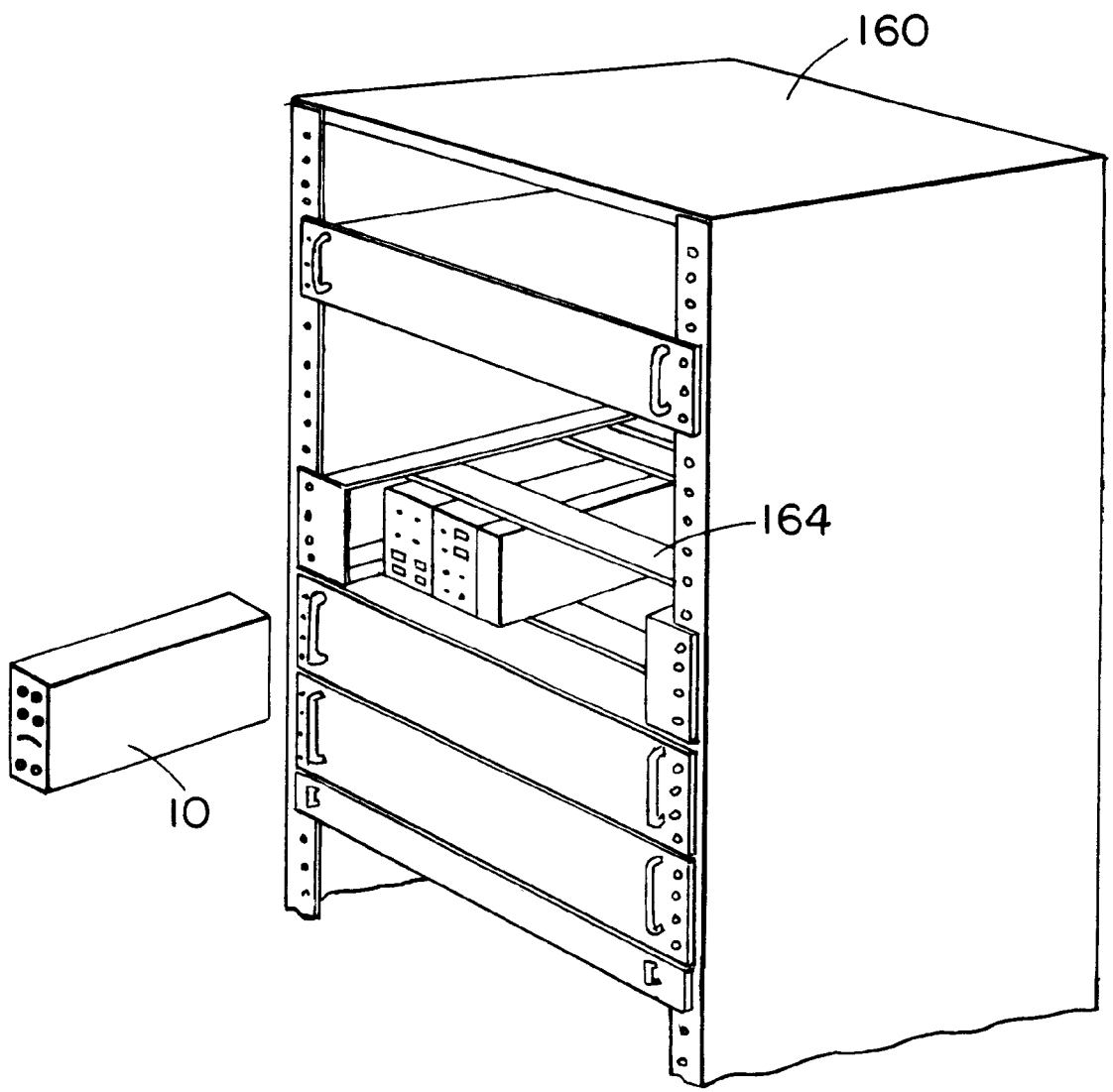
FIG. 16 is a view showing the installation of electronic modules in a rack configuration.

Referring to FIGS. 14–16, the electronic modules 10 can be mounted remotely from the cryogenic pump, for example in a rack 160. FIG. 14 illustrates a typical rack which in the past has had a mounting location for an on-board network terminal or VNC. With the electronic module configuration of the present invention, many electronic modules 10 can be placed in the location of the VNC in the rack 160. The electronic modules can be mounted, for example by using brackets, to the uprights in a subrack 164 in the rack. The subrack is mounted in the same position as the VNC. A front panel 162 is provided in the rack for a display panel to be disposed therein. The electronic modules can be spaced in a subrack 164 for airflow.

Figure 17:
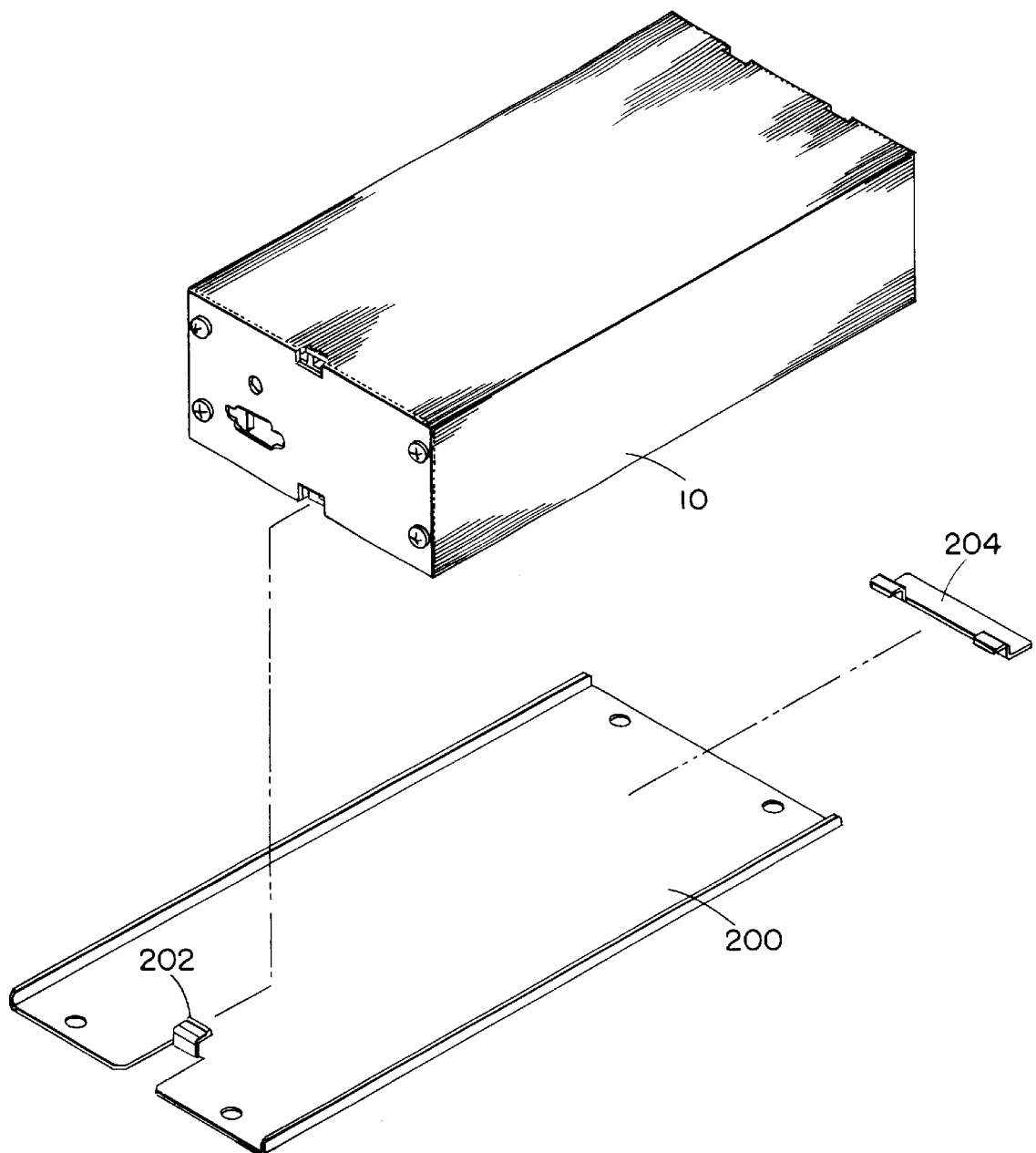
FIG. 17 is a front view showing the installation of an electronic module using a mounting bracket in accordance with the present invention.
Figure 18:
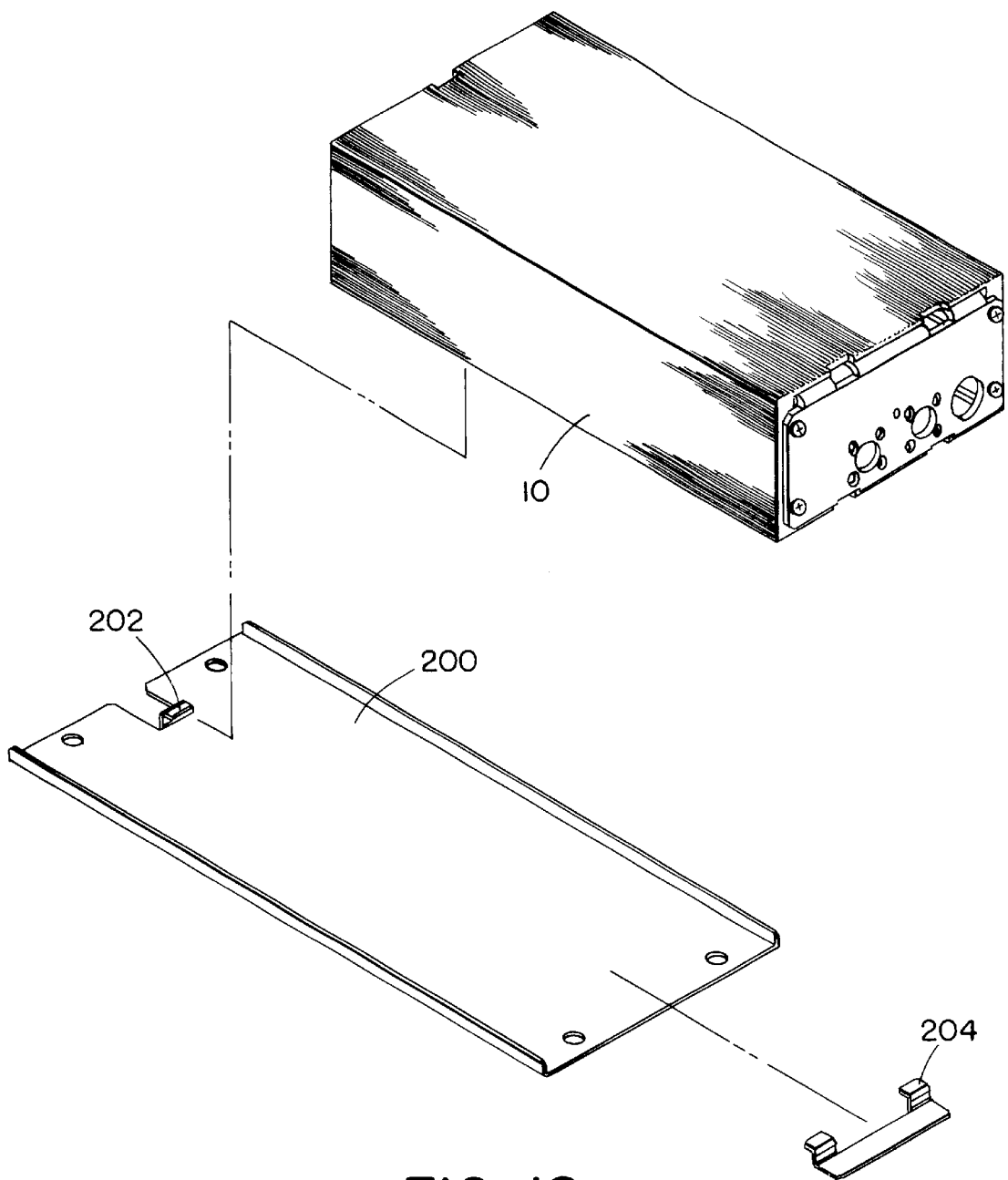
FIG. 18 is a rear view showing the installation of an electronic module using a mounting bracket in accordance with the present invention.

Referring to FIGS. 17 and 18, both a front and rear view of an electronic module 10 that is installed using a mounting bracket 200 is illustrated. In a preferred embodiment, the electronic module is mounted to any available surface of the cryopump system using the mounting bracking 200. A front mounting guide 202 assists in locating the electronic module 10 with respect to the mounting bracket. A rear mounting clip 204 secures the bracket 200 to the electronic module 10.

While this invention has been particularly shown and described with references to preferred embodiments thereof, it will be understood by those skilled in the art that various changes in form and details may be made therein without departing from the scope of the invention encompassed by the appended claims.

What is claimed is:

1. A cryopump system comprising, as an integral assembly:

a refrigerator;

cryopumping surfaces cooled by the refrigerator;

a first electronic module for controlling the cryopump mounted thereto, the first electronic module having a housing with a first exterior side surface; and a second electronic module which electrically connects to the first electronic module, the second electronic module having a first surface which complements the first surface of the housing of the first electronic module, the second electronic module being removably coupled to the first electronic module with the first surface of the second electronic module abutting the first exterior side surface of the first electronic module.

2. A cryopump system as claimed in claim 1 wherein the housing of the first electronic module has three orthogonal surfaces of approximately the same dimensions, the second module being removably mountable to each of the three surfaces.

3. A cryopump system as claimed in claim 1 further comprising a third electronic module removably coupled to the second electronic module in a stack configuration.

4. A cryopump system as claimed in claim 1 further comprising a module cap coupled to an end of the second electronic module to shield electrical connections between the first and second electronic modules.

5. A cryopump system as claimed in claim 4 further comprising a base cover covering a base portion of the cryopump, the module cap being coupled to the base cover and connections between the first and second electronic modules extending through the module cap and the base cover.

6. A cryopump system as claimed in claim 1 further comprising clips at each end of the second electronic module connecting the second electronic module to the first electronic module.

7. A cryopump system as claimed in claim 6 further comprising complementary slots in each of the first electronic module and the second electronic module in which the connecting clips are seated.

8. A cryopump system as claimed in claim 1 further comprising heat transfer ribs on a surface of the second electronic module opposite to the mounting surface of the second electronic module.

9. A cryopump system as claimed in claim 1 wherein the second electronic module comprises a channel of rectangular cross section having slots therein for mounting printed circuit boards.

10. The cryopump system as claimed in claim 1 wherein the first surface of the second electronic module has similar dimensions to the first exterior side surface of the first electronic module.

11. A cryopump system comprising, as an integral assembly:

a refrigerator;

cryopumping surfaces cooled by the refrigerator; and an electronic module for controlling the cryopump mounted thereto, the electronic module having mechanical connector elements on each of three exterior sides thereof for mounting additional electronic modules thereto.

12. A cryopump system as claimed in claim 11 wherein the connector elements are slots for receiving clips.

13. The cryopump system as claimed in claim 11 wherein said additional electronic modules each have a surface for abutting an exterior side of the electronic module and having similar dimensions thereof.

14. A cryopump system comprising:

a refrigerator;

cryopumping surfaces cooled by the refrigerator;

a first electronic module for controlling the cryopump integrally mounted thereto;

a mounting bracket having mechanical connector elements on two exterior sides; and at least one additional electronic module adapted to be mounted to one of the first electronic module and to the mounting bracket.

* * * * *